United States Patent
Gillard et al.

(10) Patent No.: US 8,445,791 B2
(45) Date of Patent: May 21, 2013

(54) IMPLEMENTING INCREASED LATCHING FORCE WITH GASKET FOR PERPENDICULAR SURFACES

(75) Inventors: Edward C. Gillard, Mantorville, MN (US); Don A. Gilliland, Rochester, MN (US); Thomas J. McPhee, III, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 345 days.

(21) Appl. No.: 12/957,875

(22) Filed: Dec. 1, 2010

(65) Prior Publication Data

US 2012/0138353 A1    Jun. 7, 2012

(51) Int. Cl.
  *H05K 9/00*    (2006.01)
(52) U.S. Cl.
  USPC .......................................... 174/354; 174/366
(58) Field of Classification Search
  USPC ............... 174/354, 366; 361/816; 439/607.18
  See application file for complete search history.

(56) References Cited

U.S. PATENT DOCUMENTS

| | | | | |
|---|---|---|---|---|
| 5,107,070 A | * | 4/1992 | Benn et al. | 174/354 |
| 5,120,903 A | * | 6/1992 | Tam | 174/354 |
| 6,073,896 A | * | 6/2000 | McFadden | 248/231.81 |
| 6,283,770 B1 | * | 9/2001 | Leung et al. | 439/92 |
| 6,355,878 B1 | * | 3/2002 | Kim | 174/355 |
| 6,667,872 B2 | * | 12/2003 | Hsu | 361/144 |
| 7,129,421 B2 | * | 10/2006 | Reis et al. | 174/354 |
| 7,442,880 B2 | * | 10/2008 | Nasstrom et al. | 174/354 |
| 7,646,592 B2 | * | 1/2010 | McCormick et al. | 361/679.02 |
| 8,203,083 B2 | * | 6/2012 | Song | 174/354 |
| 2006/0157273 A1 | * | 7/2006 | White | 174/354 |
| 2007/0012478 A1 | * | 1/2007 | Nasstrom et al. | 174/354 |
| 2007/0114060 A1 | * | 5/2007 | Barringer et al. | 174/354 |

* cited by examiner

*Primary Examiner* — Hung Ngo
(74) *Attorney, Agent, or Firm* — Joan Pennington

(57) ABSTRACT

A method and structures are provided for implementing a latching gasket including an electrically conductive fabric, and a latching clip. The latching clip includes a support member carrying the electrically conductive fabric for radio frequency (RF) connection engagement with a first wall surface. The latching clip includes a first channel-defining member and a second channel-defining member extending downwardly from the support member. The first channel-defining member carries the electrically conductive fabric for radio frequency (RF) connection engagement with a second wall surface received in a channel defined by the first and second channel-defining members. The latching clip includes a latch arm extending outwardly and downwardly from an end of the support member near the second channel-defining member. The second channel-defining member includes an outwardly and upwardly extending plate with at least one latching tab for latching engagement and spring biasing with the latch arm in a closed position of the latching gasket.

20 Claims, 3 Drawing Sheets

IMPLEMENTING INCREASED LATCHING FORCE WITH GASKET FOR PERPENDICULAR SURFACES

FIELD OF THE INVENTION

The present invention relates generally to the data processing field, and more particularly, relates to a method and structures for implementing a latching gasket providing a radio frequency (RF) connection between two perpendicular surfaces.

DESCRIPTION OF THE RELATED ART

Conductive fabric over foam gaskets have been used for shielding an electric or electronic device with respect to electromagnetic interference (EMI) or radio frequency interference (RFI).

A problem exists in making a secure RF connection between two surfaces, including one surface perpendicular to another surface, as an edge to a plate. Installation of a gasket between two surfaces, including one surface perpendicular to another surface as an edge to a plate often involves shear forces, for example, which tends to pull the gasket off the surface.

A need exists for an efficient and effective mechanism for implementing an enhanced latching gasket, for example, to provide a radio frequency (RF) connection between two perpendicular surfaces.

SUMMARY OF THE INVENTION

Principal aspects of the present invention are to provide a method and structures for implementing a latching gasket. Other important aspects of the present invention are to provide such method and structures substantially without negative effects and that overcome many of the disadvantages of prior art arrangements.

In brief, a method and structures are provided for implementing a latching gasket including an electrically conductive fabric, and a latching clip. The latching clip includes a support member carrying the electrically conductive fabric for radio frequency (RF) connection engagement with a first wall surface. The latching clip includes a first channel-defining member and a second channel-defining member extending downwardly from the support member. The first channel-defining member carries the electrically conductive fabric for radio frequency (RF) connection engagement with a second wall surface received in a channel defined by the first and second channel-defining members. The latching clip includes a latch arm extending outwardly and downwardly from an end of the support member near the second channel-defining member. The second channel-defining member includes an outwardly and upwardly extending plate with at least one latching tab for latching engagement and spring biasing with the latch arm in a closed position of the latching gasket.

In accordance with features of the invention, the latching clip is a unitary member, for example, formed of a plastic material. The electrically conductive fabric is a unitary sheet extending around at least a portion of the support member and of the first channel-defining member.

In accordance with features of the invention, the support member carrying the electrically conductive fabric includes a compressive gasket portion defined by the electrically conductive fabric extending over a resilient gasket member for radio frequency (RF) connection engagement with a first surface.

In accordance with features of the invention, the resilient gasket member includes a foam core at least partially surrounded by the electrically conductive fabric.

In accordance with features of the invention, in the closed position of the latching gasket, increased force is provided on both the first wall surface and the second perpendicular wall surface in the channel, lowering the RF impedance between the two surfaces and forming a good electrical seal.

BRIEF DESCRIPTION OF THE DRAWINGS

The present invention together with the above and other objects and advantages may best be understood from the following detailed description of the preferred embodiments of the invention illustrated in the drawings, wherein.

DETAILED DESCRIPTION OF THE PREFERRED EMBODIMENTS

In the following detailed description of embodiments of the invention, reference is made to the accompanying drawings, which illustrate example embodiments by which the invention may be practiced. It is to be understood that other embodiments may be utilized and structural changes may be made without departing from the scope of the invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

In accordance with features of the invention, a method and structures are provided for implementing an enhanced latching gasket, for example, to provide a radio frequency (RF) connection between two perpendicular surfaces.

Figure 1:
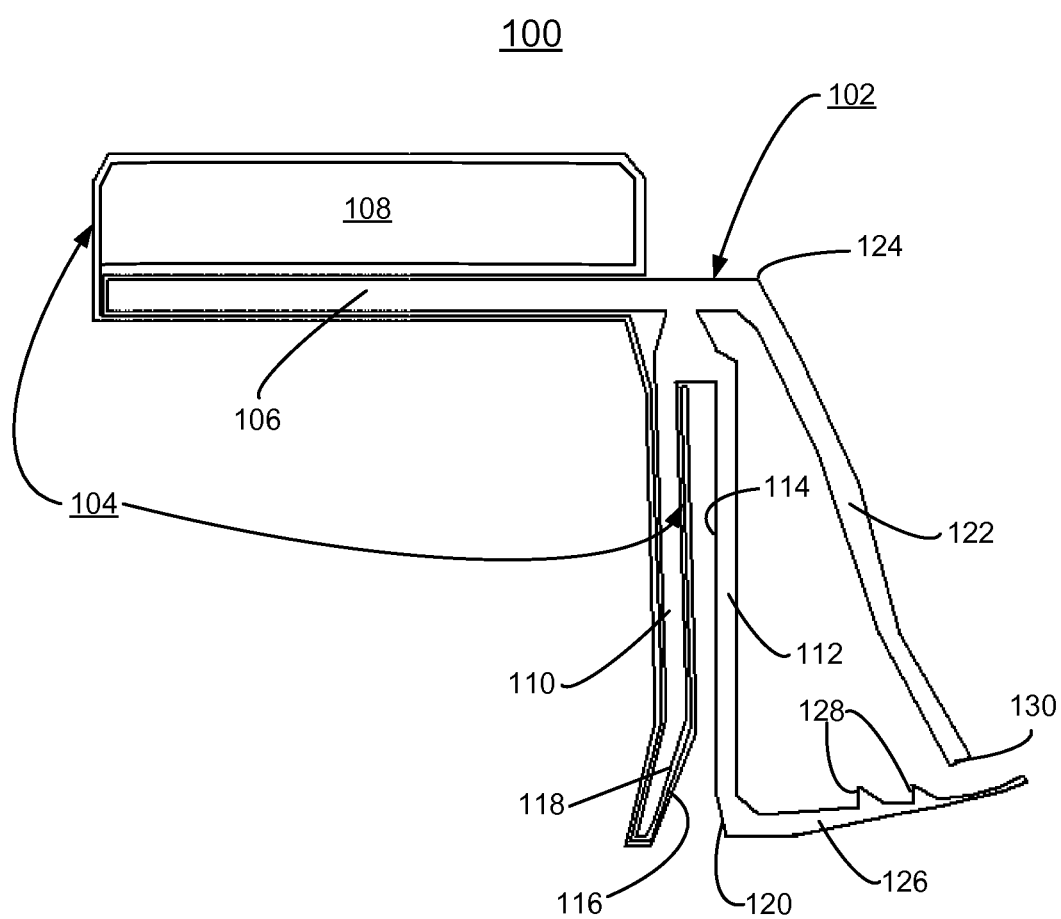
FIG. 1 is schematic side view schematically illustrating not to scale a latching gasket structure in accordance with the preferred embodiment.

Having reference now to the drawings, in FIG. 1, there is shown a latching gasket structure generally designated by the reference character 100 in accordance with the preferred embodiment. The latching gasket 100 includes a latching clip generally designated by the reference character 102, and an electrically conductive fabric generally designated by the reference character 104.

Figure 2:
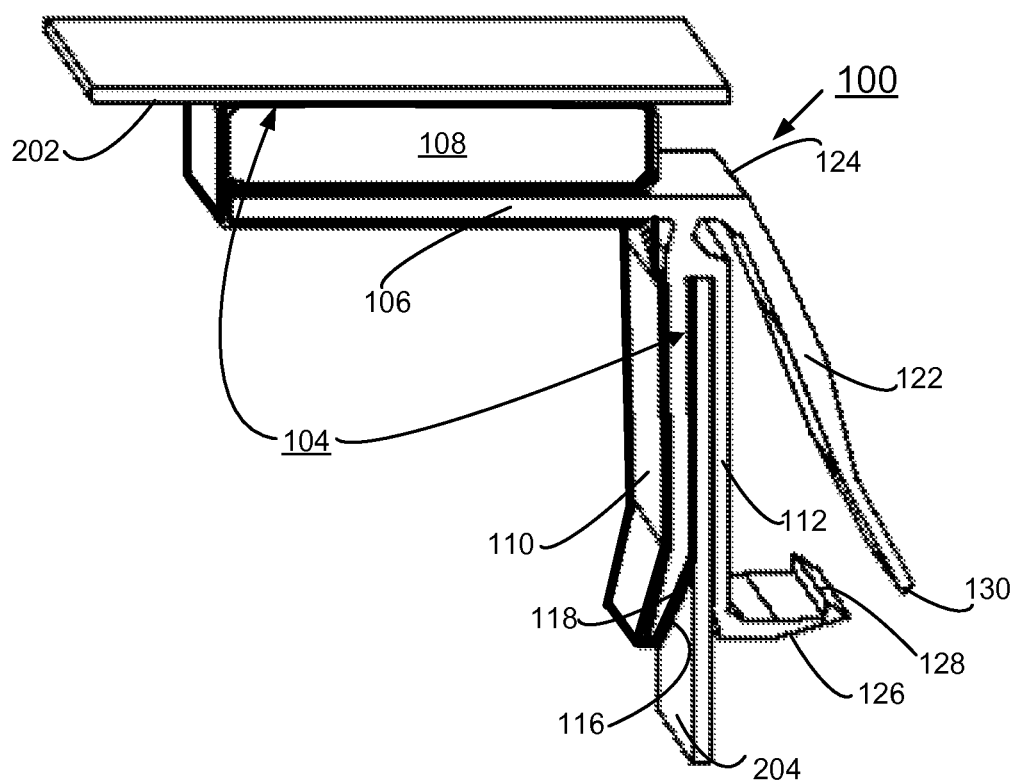
FIGS. 2 and 3 respectively illustrating not to scale the latching gasket structure of FIG. 1 in an open position and a closed position together with a pair of mating perpendicular surfaces in accordance with the preferred embodiment in accordance with the preferred embodiment.
Figure 3:
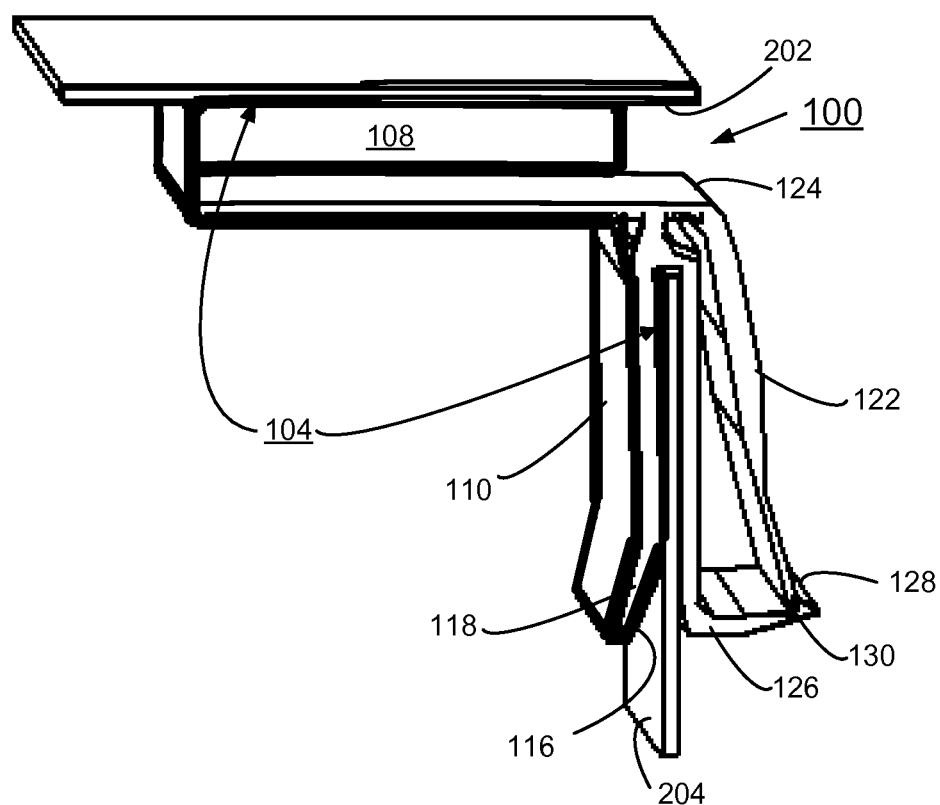

The latching clip 102 includes an upper support member 106 carrying the electrically conductive fabric 104 with a resilient, compressive gasket portion over a resilient foam core or foam 108 for radio frequency (RF) connection engagement with a first wall surface 202 as illustrated and described with respect to FIGS. 2 and 3. The resilient foam core 108 has a rectangular shape.

The latching clip 102 includes a first channel-defining member 110 and a second channel-defining member 112 extending downwardly from the support member 106. The first channel-defining member 110 carries the electrically conductive fabric 104 for radio frequency (RF) connection engagement with a second wall surface 204 as illustrated and described with respect to FIGS. 2 and 3, with the second wall surface 204 received in a channel 114 defined by the first and second channel-defining members 110, 112. The channel 114 includes a tapered entry 116 defined by respective diverging wall portions 118, 120 of the first and second channel-defining members 110, 112.

The latching clip 102 includes a latch arm 122 extending outwardly and downwardly from an end 124 of the support member 106 near the second channel-defining member 112. The second channel-defining member 112 includes an outwardly and upwardly extending plate 126 with at least one latching tab 128 for latching engagement and spring biasing with a distal end 130 of the latch arm 122 in a closed position of the latching gasket.

The latching clip 102 is a unitary member, for example, formed of a plastic material. The first and second channel-defining members 110, 112 receiving the second perpendicular surface 204 together with the latch arm 122 provide latching and spring bias operation. In the closed position of the latching gasket 100, increased force is provided on both the first surface 202 and the second perpendicular surface 204 in the channel 114, lowering the RF impedance between the two surfaces 202, 204 and forming a good electrical seal. The latching clip 102 is formed of a plastic material providing spring force action between the open and closed positions of the latching gasket 100.

The electrically conductive fabric 104 is a unitary sheet, for example, substantially extending around the support member 106 and the resilient foam core 108 and substantially extending around the first channel-defining member 110. The electrically conductive fabric 104 includes, for example, a copper coated polyester mesh. A mounting adhesive can be used to secure the electrically conductive fabric 104 to the latching clip 102 and the resilient foam core 108.

It should be understood that the resilient gasket portion includes the foam core 108 is substantially completely surrounded by, or at least partially covered by the electrically conductive fabric 104, which is placed in electrical conductive engagement with the first surface 202 for radio frequency (RF) connection engagement with the first surface.

Referring to FIGS. 2 and 3, the latching gasket structure 100 is respectively illustrated not to scale in an open position generally designated by the reference character 200 and a closed position generally designated by the reference character 300 together with the pair of perpendicular surfaces 202, 204 in accordance with the preferred embodiment.

In FIGS. 2 and 3, identical reference characters are used for identical or substantially similar components of the gasket structure 100 with the pair of perpendicular surfaces 202, 204. In the illustrated latching gasket structure 100 of FIGS. 2 and 3, an example electrically conductive fabric 104 is shown with darker lines. In FIGS. 2 and 3, the outwardly and upwardly extending plate 126 is shown with one latching tab 128 provided at the end of the plate 126 for latching engagement and spring biasing with the distal end 130 of the latch arm 122 in a closed position of the latching gasket 100, such as shown in FIG. 3.

Referring to FIG. 2, the latching gasket structure 100 is shown in the open position 200 with the first wall surface 202 positioned above the conductive fabric 104 and the compressible foam 108. The second perpendicular wall surface 204 is shown positioned within the channel 114 defined by the first and second channel-defining members 110, 112 and with the latch arm 122 shown in the open position spaced apart from the latching tab 128 provided at the end of the plate 126.

Referring to FIG. 3, the latching gasket structure 100 is shown in the closed position 300 with the first wall surface 202 positioned above the conductive fabric 104 and the compressible foam 108. The second perpendicular wall surface 204 is shown positioned within the channel 114 defined by the first and second channel-defining members 110, 112 and with the latch arm 122 shown in the closed position with its distal end 130 engaging the latching tab 128 provided at the end of the plate 126. The outstanding plate 126 of the channel-defining member 112 is flexed downwardly and the distal end 130 of the latch arm is moved inwardly past the latching tab 128 to provide the closed position 300.

In the closed position 300 of the latching gasket structure 100, force is applied to the first surface 202 compressing the foam 108 and force is applied to the second perpendicular surface 204 by the latching gasket structure. The closed position 300 of the latching gasket structure 100 provides an effective RF connection between the two surfaces 202, 204 and forming a good electrical seal.

It should be understood that the present invention is not limited to the illustrated latching gasket structure 100; for example, compressible foam could be placed on the vertical surface of the channel-defining member 110 to optionally allow additional compliance and provide a better contact surface with the second perpendicular surface 204 by the latching gasket structure 100.

While the present invention has been described with reference to the details of the embodiments of the invention shown in the drawing, these details are not intended to limit the scope of the invention as claimed in the appended claims.

What is claimed is:

1. A structure for implementing a latching gasket comprising:
   an electrically conductive fabric;
   a latching clip; said latching clip including a support member carrying the electrically conductive fabric for radio frequency (RF) connection engagement with a first wall surface;
   said latching clip including a first channel-defining member and a second channel-defining member extending downwardly from the support member; said first channel-defining member carries the electrically conductive fabric for radio frequency (RF) connection engagement with a second wall surface received in a channel defined by the first and second channel-defining members;
   said latching clip including a latch arm extending outwardly and downwardly from an end of said support member near said second channel-defining member; and
   said second channel-defining member including an outwardly and upwardly extending plate with at least one latching tab for latching engagement and spring biasing with the latch arm in a closed position of the latching gasket.

2. The structure as recited in claim 1 wherein said electrically conductive fabric is a unitary sheet.

3. The structure as recited in claim 1 wherein said electrically conductive fabric is formed of a copper coated polyester mesh.

4. The structure as recited in claim 1 wherein said latching clip is a unitary member.

5. The structure as recited in claim 1 wherein said latching clip is formed of a plastic material.

6. The structure as recited in claim 1 wherein said latching clip is formed of an electrically nonconductive material.

7. The structure as recited in claim 1 wherein said latching clip is formed of a plastic material having spring force action in the closed position.

8. The structure as recited in claim 1 wherein said latching clip is formed by injection molding.

9. The structure as recited in claim 1 wherein said support member carrying said electrically conductive fabric includes a compressive gasket portion for radio frequency (RF) connection engagement with the first surface.

10. The structure as recited in claim 1 wherein said compressive gasket portion includes a resilient foam core.

11. The structure as recited in claim 1 wherein said electrically conductive fabric includes a copper coated polyester mesh.

12. The structure as recited in claim 1 wherein said channel defined by the first and second channel-defining members includes a tapered entry for receiving said second wall surface.

13. The structure as recited in claim 1 wherein said second wall surface in the channel is perpendicular to said first wall surface.

14. A method for implementing a latching gasket providing a radio frequency (RF) connection between two perpendicular surfaces comprising:
   providing an electrically conductive fabric;
   providing a latching clip; providing said latching clip with a support member carrying the electrically conductive fabric for radio frequency (RF) connection engagement with a first wall surface;
   providing said latching clip with a first channel-defining member and a second channel-defining member extending downwardly from the support member; said first channel-defining member carries the electrically conductive fabric for radio frequency (RF) connection engagement with a second perpendicular wall surface received in a channel defined by the first and second channel-defining members;
   providing said latching clip including a latch arm extending outwardly and downwardly from an end of said support member near said second channel-defining member; and
   providing said second channel-defining member including an outwardly and upwardly extending plate with at least one latching tab for latching engagement and spring biasing with the latch arm in a closed position of the latching gasket.

15. The method as recited in claim 14 wherein providing a latching clip includes forming said latching clip of a plastic material.

16. The method as recited in claim 14 wherein providing a latching clip includes forming said latching clip by injection molding a unitary member.

17. The method as recited in claim 14 wherein providing an electrically conductive fabric includes providing a unitary sheet of electrically conductive fabric.

18. The method as recited in claim 14 wherein providing an electrically conductive fabric includes providing a unitary sheet of a copper coated polyester mesh.

19. The method as recited in claim 14 wherein providing said latching clip with a support member carrying the electrically conductive fabric for radio frequency (RF) connection engagement with a first wall surface includes providing a compressive gasket portion carried by said support member, said compressive gasket portion including a resilient foam core.

20. The method as recited in claim 14 wherein providing said latching clip with a first channel-defining member and a second channel-defining member includes providing said first channel-defining member and said second channel-defining member with divergent wall portions defining a tapered entry for receiving said second perpendicular wall surface.

\* \* \* \* \*